(12) United States Patent
Miki

(10) Patent No.: US 6,259,383 B1
(45) Date of Patent: Jul. 10, 2001

(54) LOGIC CIRCUIT AND SIGNAL TRANSMISSION METHOD

(75) Inventor: Yoshio Miki, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/267,596

(22) Filed: Mar. 15, 1999

(30) Foreign Application Priority Data

Mar. 17, 1998 (JP) .................................................. 10-066488

(51) Int. Cl.$^7$ ...................................................... H03M 5/00
(52) U.S. Cl. .............................................. 341/52; 341/102
(58) Field of Search ............................ 341/52, 102, 103, 341/67, 95, 50–53, 59–61, 173, 174; 375/354, 39

(56) References Cited

U.S. PATENT DOCUMENTS 4,855,742 * 8/1989 Verboom ............................... 341/102
5,168,509 * 12/1992 Nakamura et al. ..................... 375/39
5,651,033 * 7/1997 Gregg et al. ........................... 375/354

OTHER PUBLICATIONS

A. Chandrakasan et al, "A Low Power Chipset for Portable Multimedia Applications", 1994 IEEE International Solid––State Circuits Conference, 1994, Session 5, pp. 82–83.

PowerPC 601—RISC Microprocessor User's Manual, p. 1–37.

J. Mavor et al, "Introduction to MOS LSI Design", 1983, pp. 198–200.

* cited by examiner

Primary Examiner—Brian Young
Assistant Examiner—John Nguyen
(74) Attorney, Agent, or Firm—Mattingly, Stranger & Malur, P.C.

(57) ABSTRACT

In the transmission of a logic signal, there is a reduced maximum value and a reduced average value of the number of bits varied by transforming an input level representation original logic signal having n bits into a transition representation logic signal of m groups with only a maximum of k bits varied, wherein k and m are integer numbers, n is greater than k and each value of k and m is greater than 1. The transformed logic signal of m groups is transmitted. The transmitted logic signal of m groups is then transformed into the original logic signal having n bits. A maximum number of bits varied is k, which can be below n/2 as a maximum, which is less than an average bit variation of the input original signal.

10 Claims, 18 Drawing Sheets

FIG. 3

| S14 | S13 | S12 | S11 | S24 | S23 | S22 | S21 | REPRESENTING NUMBER | (b4 b3 b2 b1) |
|---|---|---|---|---|---|---|---|---|---|
| U | U | U | C | U | U | U | C | 0 | (0000) |
| U | U | U | C | U | U | C | U | 1 | (0001) |
| U | U | U | C | U | C | U | U | 2 | (0010) |
| U | U | U | C | C | U | U | U | 3 | (0011) |
| U | U | C | U | U | U | U | C | 4 | (0100) |
| U | U | C | U | U | U | C | U | 5 | (0101) |
| U | U | C | U | U | C | U | U | 6 | (0110) |
| U | U | C | U | C | U | U | U | 7 | (0111) |
| U | C | U | U | U | U | U | C | 8 | (1000) |
| U | C | U | U | U | U | C | U | 9 | (1001) |
| U | C | U | U | U | C | U | U | 10 | (1010) |
| U | C | U | U | C | U | U | U | 11 | (1011) |
| C | U | U | U | U | U | U | C | 12 | (1100) |
| C | U | U | U | U | U | C | U | 13 | (1101) |
| C | U | U | U | U | C | U | U | 14 | (1110) |
| C | U | U | U | C | U | U | U | 15 | (1111) |

| LEVEL REPRESENTING NUMBER | TRANSITION REPRESENTING NUMBER | | LEVEL REPRESENTING NUMBER | TRANSITION REPRESENTING NUMBER | | LEVEL REPRESENTING NUMBER | TRANSITION REPRESENTING NUMBER | |
|---|---|---|---|---|---|---|---|---|
| 00000000 | 00000011 | 00000011 | 01000000 | 00001001 | 00001010 | 10000000 | 00100001 | 01000100 |
| 00000001 | 00000011 | 00000101 | 01000001 | 00001001 | 00010010 | 10000001 | 00100001 | 10000100 |
| 00000010 | 00000011 | 00001001 | 01000010 | 00001001 | 00100010 | 10000010 | 00100001 | 00011000 |
| 00000011 | 00000011 | 00010001 | 01000011 | 00001001 | 01000010 | 10000011 | 00100001 | 00101000 |
| 00000100 | 00000011 | 00100001 | 01000100 | 00001001 | 10000010 | 10000100 | 00100001 | 01001000 |
| 00000101 | 00000011 | 01000001 | 01000101 | 00001001 | 00001100 | 10000101 | 00100001 | 10001000 |
| 00000110 | 00000011 | 10000001 | 01000110 | 00001001 | 00010100 | 10000110 | 00100001 | 00110000 |
| 00000111 | 00000011 | 00000110 | 01000111 | 00001001 | 00100100 | 10000111 | 00100001 | 01010000 |
| 00001000 | 00000011 | 00001010 | 01001000 | 00001001 | 01000100 | 10001000 | 00100001 | 10010000 |
| 00001001 | 00000011 | 00010010 | 01001001 | 00001001 | 10000100 | 10001001 | 00100001 | 01100000 |
| 00001010 | 00000011 | 00100010 | 01001010 | 00001001 | 00011000 | 10001010 | 00100001 | 10100000 |
| 00001011 | 00000011 | 01000010 | 01001011 | 00001001 | 00101000 | 10001011 | 00100001 | 11000000 |
| 00001100 | 00000011 | 10000010 | 01001100 | 00001001 | 01001000 | 10001100 | 01000001 | 00000011 |
| 00001101 | 00000011 | 00001100 | 01001101 | 00001001 | 10001000 | 10001101 | 01000001 | 00000101 |
| 00001110 | 00000011 | 00010100 | 01001110 | 00001001 | 00110000 | 10001110 | 01000001 | 00001001 |
| 00001111 | 00000011 | 00100100 | 01001111 | 00001001 | 01010000 | 10001111 | 01000001 | 00010001 |
| 00010000 | 00000011 | 01000100 | 01010000 | 00001001 | 10010000 | 10010000 | 01000001 | 00100001 |
| 00010001 | 00000011 | 10000100 | 01010001 | 00001001 | 01100000 | 10010001 | 01000001 | 01000001 |
| 00010010 | 00000011 | 00011000 | 01010010 | 00001001 | 10100000 | 10010010 | 01000001 | 10000001 |
| 00010011 | 00000011 | 00101000 | 01010011 | 00001001 | 11000000 | 10010011 | 01000001 | 00000110 |
| 00010100 | 00000011 | 01001000 | 01010100 | 00001001 | 00000011 | 10010100 | 01000001 | 00001010 |
| 00010101 | 00000011 | 10001000 | 01010101 | 00001001 | 00000101 | 10010101 | 01000001 | 00010010 |
| 00010110 | 00000011 | 00110000 | 01010110 | 00001001 | 00001001 | 10010110 | 01000001 | 00100010 |
| 00010111 | 00000011 | 01010000 | 01010111 | 00001001 | 00010001 | 10010111 | 01000001 | 01000010 |
| 00011000 | 00000011 | 10010000 | 01011000 | 00001001 | 00100001 | 10011000 | 01000001 | 10000000 |
| 00011001 | 00000011 | 01100000 | 01011001 | 00001001 | 01000001 | 10011001 | 01000001 | 00001100 |
| 00011010 | 00000011 | 10100000 | 01011010 | 00001001 | 10000001 | 10011010 | 01000001 | 00010100 |
| 00011011 | 00000011 | 11000000 | 01011011 | 00001001 | 00000110 | 10011011 | 01000001 | 00100100 |
| 00011100 | 00000101 | 00000011 | 01011100 | 00001001 | 00001010 | 10011100 | 01000001 | 01000100 |
| 00011101 | 00000101 | 00000101 | 01011101 | 00001001 | 00010010 | 10011101 | 01000001 | 10000100 |
| 00011110 | 00000101 | 00001001 | 01011110 | 00001001 | 00100010 | 10011110 | 01000001 | 00011000 |
| 00011111 | 00000101 | 00010001 | 01011111 | 00001001 | 01000010 | 10011111 | 01000001 | 00101000 |
| 00100000 | 00000101 | 00100001 | 01100000 | 00001001 | 10000010 | 10100000 | 01000001 | 01001000 |
| 00100001 | 00000101 | 01000001 | 01100001 | 00001001 | 00001100 | 10100001 | 01000001 | 10001000 |
| 00100010 | 00000101 | 10000001 | 01100010 | 00001001 | 00010100 | 10100010 | 01000001 | 00110000 |

FIG. 14A

| LEVEL REPRESENTING NUMBER | TRANSITION REPRESENTING NUMBER | | LEVEL REPRESENTING NUMBER | TRANSITION REPRESENTING NUMBER | | LEVEL REPRESENTING NUMBER | TRANSITION REPRESENTING NUMBER | |
|---|---|---|---|---|---|---|---|---|
| 00100011 | 00000101 | 00000110 | 01100011 | 00010001 | 00100100 | 10100011 | 01000001 | 01010000 |
| 00100100 | 00000101 | 00001010 | 01100100 | 00010001 | 01000100 | 10100100 | 01000001 | 10010000 |
| 00100101 | 00000101 | 00010010 | 01100101 | 00010001 | 10000100 | 10100101 | 01000001 | 01100000 |
| 00100110 | 00000101 | 00100010 | 01100110 | 00010001 | 00011000 | 10100110 | 01000001 | 10100000 |
| 00100111 | 00000101 | 01000010 | 01100111 | 00010001 | 00101000 | 10100111 | 01000001 | 11000000 |
| 00101000 | 00000101 | 10000010 | 01101000 | 00010001 | 01001000 | 10101000 | 10000001 | 00000011 |
| 00101001 | 00000101 | 00001100 | 01101001 | 00010001 | 10001000 | 10101001 | 10000001 | 00000101 |
| 00101010 | 00000101 | 00010100 | 01101010 | 00010001 | 00110000 | 10101010 | 10000001 | 00001001 |
| 00101011 | 00000101 | 00100100 | 01101011 | 00010001 | 01010000 | 10101011 | 10000001 | 00010001 |
| 00101100 | 00000101 | 01000100 | 01101100 | 00010001 | 10010000 | 10101100 | 10000001 | 00100001 |
| 00101101 | 00000101 | 10000100 | 01101101 | 00010001 | 01100000 | 10101101 | 10000001 | 01000001 |
| 00101110 | 00000101 | 00011000 | 01101110 | 00010001 | 10100000 | 10101110 | 10000001 | 10000001 |
| 00101111 | 00000101 | 00101000 | 01101111 | 00010001 | 11000000 | 10101111 | 10000001 | 00000110 |
| 00110000 | 00000101 | 01001000 | 01110000 | 00100001 | 00000011 | 10110000 | 10000001 | 00001010 |
| 00110001 | 00000101 | 10001000 | 01110001 | 00100001 | 00000101 | 10110001 | 10000001 | 00010010 |
| 00110010 | 00000101 | 00110000 | 01110010 | 00100001 | 00001001 | 10110010 | 10000001 | 00100010 |
| 00110011 | 00000101 | 01010000 | 01110011 | 00100001 | 00010001 | 10110011 | 10000001 | 01000010 |
| 00110100 | 00000101 | 10010000 | 01110100 | 00100001 | 00100001 | 10110100 | 10000001 | 10000010 |
| 00110101 | 00000101 | 01100000 | 01110101 | 00100001 | 01000001 | 10110101 | 10000001 | 00001100 |
| 00110110 | 00000101 | 10100000 | 01110110 | 00100001 | 10000001 | 10110110 | 10000001 | 00010100 |
| 00110111 | 00000101 | 11000000 | 01110111 | 00100001 | 00000110 | 10110111 | 10000001 | 00100100 |
| 00111000 | 00001001 | 00000011 | 01111000 | 00100001 | 00001010 | 10111000 | 10000001 | 01000100 |
| 00111001 | 00001001 | 00000101 | 01111001 | 00100001 | 00010010 | 10111001 | 10000001 | 10000100 |
| 00111010 | 00001001 | 00001001 | 01111010 | 00100001 | 00100010 | 10111010 | 10000001 | 00011000 |
| 00111011 | 00001001 | 00010001 | 01111011 | 00100001 | 01000010 | 10111011 | 10000001 | 00101000 |
| 00111100 | 00001001 | 00100001 | 01111100 | 00100001 | 10000010 | 10111100 | 10000001 | 01001000 |
| 00111101 | 00001001 | 01000001 | 01111101 | 00100001 | 00001100 | 10111101 | 10000001 | 10001000 |
| 00111110 | 00001001 | 10000001 | 01111110 | 00100001 | 00010100 | 10111110 | 10000001 | 00110000 |
| 00111111 | 00001001 | 00000110 | 01111111 | 00100001 | 00100100 | 10111111 | 10000001 | 01010000 |

FIG. 14B

| LEVEL REPRESENTING NUMBER | TRANSITION REPRESENTING NUMBER | |
|---|---|---|
| 11000000 | 10000001 | 10010000 |
| 11000001 | 10000001 | 01100000 |
| 11000010 | 10000001 | 10100000 |
| 11000011 | 10000001 | 11000000 |
| 11000100 | 00000110 | 00000011 |
| 11000101 | 00000110 | 00000101 |
| 11000110 | 00000110 | 00001001 |
| 11000111 | 00000110 | 00010001 |
| 11001000 | 00000110 | 00100001 |
| 11001001 | 00000110 | 01000001 |
| 11001010 | 00000110 | 10000001 |
| 11001011 | 00000110 | 00000110 |
| 11001100 | 00000110 | 00001010 |
| 11001101 | 00000110 | 00010010 |
| 11001110 | 00000110 | 00100010 |
| 11001111 | 00000110 | 01000010 |
| 11010000 | 00000110 | 10000010 |
| 11010001 | 00000110 | 00001100 |
| 11010010 | 00000110 | 00010100 |
| 11010011 | 00000110 | 00100100 |
| 11010100 | 00000110 | 01000100 |
| 11010101 | 00000110 | 10000100 |
| 11010110 | 00000110 | 00011000 |
| 11010111 | 00000110 | 00101000 |
| 11011000 | 00000110 | 01001000 |
| 11011001 | 00000110 | 10001000 |
| 11011010 | 00000110 | 00110000 |
| 11011011 | 00000110 | 01010000 |
| 11011100 | 00000110 | 10010000 |
| 11011101 | 00000110 | 01100000 |
| 11011110 | 00000110 | 10100000 |
| 11011111 | 00000110 | 11000000 |
| 11100000 | 00001010 | 00000011 |
| 11100001 | 00001010 | 00000101 |
| 11100010 | 00001010 | 00001001 |

FIG. 15A

| LEVEL REPRESENTING NUMBER | TRANSITION REPRESENTING NUMBER | |
|---|---|---|
| 11100011 | 00001010 | 00010001 |
| 11100100 | 00001010 | 00100001 |
| 11100101 | 00001010 | 01000001 |
| 11100110 | 00001010 | 10000001 |
| 11100111 | 00001010 | 00000110 |
| 11101000 | 00001010 | 00001010 |
| 11101001 | 00001010 | 00010010 |
| 11101010 | 00001010 | 00100010 |
| 11101011 | 00001010 | 01000010 |
| 11101100 | 00001010 | 10000010 |
| 11101101 | 00001010 | 00001100 |
| 11101110 | 00001010 | 00010100 |
| 11101111 | 00001010 | 00100100 |
| 11110000 | 00001010 | 01000100 |
| 11110001 | 00001010 | 10000100 |
| 11110010 | 00001010 | 00011000 |
| 11110011 | 00001010 | 00101000 |
| 11110100 | 00001010 | 01001000 |
| 11110101 | 00001010 | 10001000 |
| 11110110 | 00001010 | 00110000 |
| 11110111 | 00001010 | 01010000 |
| 11111000 | 00001010 | 10010000 |
| 11111001 | 00001010 | 01100000 |
| 11111010 | 00001010 | 10100000 |
| 11111011 | 00001010 | 11000000 |
| 11111100 | 00010010 | 00000011 |
| 11111101 | 00010010 | 00000101 |
| 11111110 | 00010010 | 00001001 |
| 11111111 | 00010010 | 00010001 |

FIG. 15B

| LEVEL REPRESENTING NUMBER | TRANSITION REPRESENTING NUMBER | | LEVEL REPRESENTING NUMBER | TRANSITION REPRESENTING NUMBER | | LEVEL REPRESENTING NUMBER | TRANSITION REPRESENTING NUMBER | |
|---|---|---|---|---|---|---|---|---|
| 00000000 | 00000001 | 00000011 | 01000000 | 00000010 | 00000001 | 10000000 | 00001000 | 01001000 |
| 00000001 | 00000001 | 00000101 | 01000001 | 00000010 | 00000010 | 10000001 | 00001000 | 10001000 |
| 00000010 | 00000001 | 00001001 | 01000010 | 00000010 | 00000100 | 10000010 | 00001000 | 00110000 |
| 00000011 | 00000001 | 00010001 | 01000011 | 00000010 | 00001000 | 10000011 | 00001000 | 01010000 |
| 00000100 | 00000001 | 00100001 | 01000100 | 00000010 | 00010000 | 10000100 | 00001000 | 10010000 |
| 00000101 | 00000001 | 01000001 | 01000101 | 00000010 | 00100000 | 10000101 | 00001000 | 01100000 |
| 00000110 | 00000001 | 10000001 | 01000110 | 00000010 | 01000000 | 10000110 | 00001000 | 10100000 |
| 00000111 | 00000001 | 00000110 | 01000111 | 00000010 | 10000000 | 10000111 | 00001000 | 11000000 |
| 00001000 | 00000001 | 00001010 | 01001000 | 00000100 | 00000011 | 10001000 | 00001000 | 00000001 |
| 00001001 | 00000001 | 00010010 | 01001001 | 00000100 | 00000101 | 10001001 | 00001000 | 00000010 |
| 00001010 | 00000001 | 00100010 | 01001010 | 00000100 | 00001001 | 10001010 | 00001000 | 00000100 |
| 00001011 | 00000001 | 01000010 | 01001011 | 0000100 | 00010001 | 10001011 | 00001000 | 00001000 |
| 00001100 | 00000001 | 10000010 | 01001100 | 00000100 | 00100001 | 10001100 | 00001000 | 00010000 |
| 00001101 | 00000001 | 00001100 | 01001101 | 00000100 | 01000001 | 10001101 | 00001000 | 00100000 |
| 00001110 | 00000001 | 00010100 | 01001110 | 00000100 | 10000001 | 10001110 | 00001000 | 01000000 |
| 00001111 | 00000001 | 00100100 | 01001111 | 00000100 | 00000110 | 10001111 | 00001000 | 10000000 |
| 00010000 | 00000001 | 01000100 | 01010000 | 00000100 | 00001010 | 10010000 | 00010000 | 00000011 |
| 00010001 | 00000001 | 10000100 | 01010001 | 00000100 | 00010010 | 10010001 | 00010000 | 00000101 |
| 00010010 | 00000001 | 00011000 | 01010010 | 00000100 | 00100010 | 10010010 | 00010000 | 00001001 |
| 00010011 | 00000001 | 00101000 | 01010011 | 00000100 | 01000010 | 10010011 | 00010000 | 00010001 |
| 00010100 | 00000001 | 01001000 | 01010100 | 00000100 | 10000010 | 10010100 | 00010000 | 00100001 |
| 00010101 | 00000001 | 10001000 | 01010101 | 00000100 | 00001100 | 10010101 | 00010000 | 01000001 |
| 00010110 | 00000001 | 01100000 | 01010110 | 00000100 | 00010100 | 10010110 | 00010000 | 10000001 |
| 00010111 | 00000001 | 01010000 | 01010111 | 00000100 | 00100100 | 10010111 | 00010000 | 00000110 |
| 00011000 | 00000001 | 10010000 | 01011000 | 00000100 | 01000100 | 10011000 | 00010000 | 00001010 |
| 00011001 | 00000001 | 01100000 | 01011001 | 00000100 | 10000100 | 10011001 | 00010000 | 00010010 |
| 00011010 | 00000001 | 10100000 | 01011010 | 00000100 | 00011000 | 10011010 | 00010000 | 00100010 |
| 00011011 | 00000001 | 11000000 | 01011011 | 00000100 | 00101000 | 10011011 | 00010000 | 01000010 |
| 00011100 | 00000001 | 00000001 | 01011100 | 00000100 | 01001000 | 10011100 | 00010000 | 10000010 |
| 00011101 | 00000001 | 00000010 | 01011101 | 00000100 | 10001000 | 10011101 | 00010000 | 00001100 |
| 00011110 | 00000001 | 00000100 | 01011110 | 0000100 | 00110000 | 10011110 | 00010000 | 00010100 |
| 00011111 | 00000001 | 00001000 | 01011111 | 00000100 | 01010000 | 10011111 | 00010000 | 00100100 |
| 00100000 | 00000001 | 00010000 | 01100000 | 00000100 | 10010000 | 10100000 | 00010000 | 01000100 |
| 00100001 | 00000001 | 00100000 | 01100001 | 00000100 | 01100000 | 10100001 | 00010000 | 10000100 |
| 00100010 | 00000001 | 01000000 | 01100010 | 00000100 | 10100000 | 10100010 | 00010000 | 00011000 |

FIG. 16A

| LEVEL REPRESENTING NUMBER | TRANSITION REPRESENTING NUMBER | LEVEL REPRESENTING NUMBER | TRANSITION REPRESENTING NUMBER | LEVEL REPRESENTING NUMBER | TRANSITION REPRESENTING NUMBER |
|---|---|---|---|---|---|
| 00100011 | 00000001 10000000 | 01100011 | 00000100 11000000 | 10100011 | 00010000 00101000 |
| 00100100 | 00000010 00000011 | 01100100 | 00000100 00000001 | 10100100 | 00010000 01001000 |
| 00100101 | 00000010 00000101 | 01100101 | 00000100 00000010 | 10100101 | 00010000 10001000 |
| 00100110 | 00000010 00001001 | 01100110 | 00000100 00000100 | 10100110 | 00010000 00110000 |
| 00100111 | 00000010 00010001 | 01100111 | 00000100 00001000 | 10100111 | 00010000 01010000 |
| 00101000 | 00000010 00100001 | 01101000 | 00000100 00010000 | 10101000 | 00010000 10010000 |
| 00101001 | 00000010 01000001 | 01101001 | 00000100 00100000 | 10101001 | 00010000 01100000 |
| 00101010 | 00000010 10000001 | 01101010 | 00000100 01000000 | 10101010 | 00010000 10100000 |
| 00101011 | 00000010 00000110 | 01101011 | 00000100 10000000 | 10101011 | 00010000 11000000 |
| 00101100 | 00000010 00001010 | 01101100 | 00001000 00000011 | 10101100 | 00010000 00000001 |
| 00101101 | 00000010 00010010 | 01101101 | 00001000 00000101 | 10101101 | 00010000 00000010 |
| 00101110 | 00000010 00100010 | 01101110 | 00001000 00001001 | 10101110 | 00010000 00000100 |
| 00101111 | 00000010 01000010 | 01101111 | 00001000 00010001 | 10101111 | 00010000 00001000 |
| 00110000 | 00000010 10000010 | 01110000 | 00001000 00100001 | 10110000 | 00010000 00010000 |
| 00110001 | 00000010 00001100 | 01110001 | 00001000 01000001 | 10110001 | 00010000 00100000 |
| 00110010 | 00000010 00010100 | 01110010 | 00001000 10000001 | 10110010 | 00010000 01000000 |
| 00110011 | 00000010 00100100 | 01110011 | 00001000 00000110 | 10110011 | 00010000 10000000 |
| 00110100 | 00000010 01000100 | 01110100 | 00001000 00001010 | 10110100 | 00100000 00000011 |
| 00110101 | 00000010 10000100 | 01110101 | 00001000 00010010 | 10110101 | 00100000 00000101 |
| 00110110 | 00000010 00011000 | 01110110 | 00001000 00100010 | 10110110 | 00100000 00001001 |
| 0010111 | 00000010 00101000 | 01110111 | 00001000 01000010 | 10110111 | 00100000 00010001 |
| 00111000 | 00000010 01001000 | 01111000 | 00001000 10000010 | 10111000 | 00100000 00100001 |
| 00111001 | 00000010 10001000 | 01111001 | 00001000 00001100 | 10111001 | 00100000 01000001 |
| 00111010 | 00000010 00110000 | 01111010 | 00001000 00010100 | 10111010 | 00100000 10000001 |
| 00111011 | 00000010 01010000 | 01111011 | 00001000 00100100 | 10111011 | 00100000 00000110 |
| 00111100 | 00000010 10010000 | 01111100 | 00001000 01000100 | 10111100 | 00100000 00001010 |
| 00111101 | 00000010 01100000 | 01111101 | 00001000 10000100 | 10111101 | 00100000 00010010 |
| 00111110 | 00000010 10100000 | 01111110 | 00001000 00011000 | 10111110 | 00100000 00100010 |
| 00111111 | 00000010 11000000 | 01111111 | 00001000 00101000 | 10111111 | 00100000 01000010 |

FIG. 16B

| LEVEL REPRESENTING NUMBER | TRANSITION REPRESENTING NUMBER |
|---|---|
| 11000000 | 00100000 10000010 |
| 11000001 | 00100000 00001100 |
| 11000010 | 00100000 00010100 |
| 11000011 | 00100000 00100100 |
| 11000100 | 00100000 01000100 |
| 11000101 | 00100000 10000100 |
| 11000110 | 00100000 00011000 |
| 11000111 | 00100000 00101000 |
| 11001000 | 00100000 01001000 |
| 11001001 | 00100000 10001000 |
| 11001010 | 00100000 00110000 |
| 11001011 | 00100000 01010000 |
| 11001100 | 00100000 10010000 |
| 11001101 | 00100000 01100000 |
| 11001110 | 00100000 10100000 |
| 11001111 | 00100000 11000000 |
| 11010000 | 00100000 00000001 |
| 11010001 | 00100000 00000010 |
| 11010010 | 00100000 00000100 |
| 11010011 | 00100000 00001000 |
| 11010100 | 00100000 00010000 |
| 11010101 | 00100000 00100000 |
| 11010110 | 00100000 01000000 |
| 11010111 | 00100000 10000000 |
| 11011000 | 01000000 00000011 |
| 11011001 | 01000000 00000101 |
| 11011010 | 01000000 00001001 |
| 11011011 | 01000000 00010001 |
| 11011100 | 01000000 00100001 |
| 11011101 | 01000000 01000001 |
| 11011110 | 01000000 10000001 |
| 11011111 | 01000000 00000110 |
| 11100000 | 01000000 00001010 |
| 11100001 | 01000000 00010010 |
| 11100010 | 00110000 00100010 |

FIG. 17A

| LEVEL REPRESENTING NUMBER | TRANSITION REPRESENTING NUMBER |
|---|---|
| 11100011 | 01000000 01000010 |
| 11100100 | 01000000 10000010 |
| 11100101 | 01000000 00001100 |
| 11100110 | 01000000 00010100 |
| 11100111 | 01000000 00100100 |
| 11101000 | 01000000 01000100 |
| 11101001 | 01000000 10000100 |
| 11101010 | 01000000 00011000 |
| 11101011 | 01000000 00101000 |
| 11101100 | 01000000 01001000 |
| 11101101 | 01000000 10001000 |
| 11101110 | 01000000 00110000 |
| 11101111 | 01000000 01010000 |
| 11110000 | 01000000 10010000 |
| 11110001 | 01000000 01100000 |
| 11110010 | 01000000 10100000 |
| 11110011 | 01000000 11000000 |
| 11110100 | 01000000 00000001 |
| 11110101 | 01000000 00000010 |
| 11110110 | 01000000 00000100 |
| 11110111 | 01000000 00001000 |
| 11111000 | 01000000 00010000 |
| 11111001 | 01000000 00100000 |
| 11111010 | 01000000 01000000 |
| 11111011 | 01000000 10000000 |
| 11111100 | 10000000 00000011 |
| 11111101 | 10000000 00000101 |
| 11111110 | 10000000 00001001 |
| 11111111 | 10000000 00010001 |

LOGIC CIRCUIT AND SIGNAL TRANSMISSION METHOD

BACKGROUND OF THE INVENTION

1. Field of the Invention

The present invention relates to transmitting a logic signal having n bits. In particular, the invention relates to reducing power consumption by reducing a maximum value and/or an average value of the number of bits that are varied at the time of transmission, as compared to the corresponding values for the logic signal before transmission.

2. Description of the Related Art

In a logic LSI represented by a microprocessor, there exists a plurality of logic signal lines for the data transmission with other logic circuits via input/output pins. For instance, in the processor indicated in Power PC 601 RISC Microprocessor User's Manual, a signal line of 32 bit lines as a memory address line and a signal line of 64 bit lines as a data line are used.

Particularly, the data line is useful for transmitting a data value requested by a program to an outside circuit and the content of the transmitted data can be considered a random value. A logic gate having a large driving capability is used for driving a large capacitance outside of the logic LSI, as indicated in Sugano et al, "MOS LSI Design Introduction" (Industrial Publisher, page 199).

From the aspect of the power consumption reduction of the whole logic circuit, it is important to reduce the frequency of operation of the logic gate, because the logic gate charges and discharges a large amount of electric charges. A method for reducing a glitch caused by the combination logic and a method for changing the representation of data value from 2's complement representation to an absolute value representation are known as a technique for limiting the frequency signal variation transmitted to and from a logic circuit, as indicated in page 82, of "International Solid-State Circuits Conference" (ISSCC '94, agenda).

SUMMARY OF THE INVENTION

In the data transmission to and from a logic circuit, by a logic gate having a large driving capability, a plurality of bits subject to a signal variation all at once causes a voltage drop of an electric power circuit and results in an error. From the aspect of power consumption reduction, it is desirable to reduce the number of bits that are varied at the time of the data transmission and reception.

An object of the present invention is to regulate a maximum value of the number of bits varied simultaneously during transmission to below a fixed value that is lower than that of a logic signal to be transmitted, and to thereby prevent an error operation due to a voltage drop and/or a power supply noise.

An object of the present invention is to reduce an average value of the number of bits varied simultaneously for a transmitted signal and therefore, to reduce power consumption.

To achieve the objects, the present invention: transforms a logic signal having n bits into a logic signal of m groups, wherein only k bits are varied, k and m are integer numbers, and each value of k and m is more than 1; transmits the logic signal of m groups; receives and transforms the received logic signal of m groups into a logic signal having the original n bits; so that a maximum value of the number of bits varied simultaneously at the time of transmission is k and less than n, and more particularly, k is less than n/2; and further so that the number of bits varied on the average during transmission is reduced as compared to the representation by the original n bits.

For example, when the level of each of all four data bit lines is varied for a clock period in the original signal as a maximum variation and the level of only two data bit lines is varied on the average in the original signal, the original signal is transformed so that only a maximum of two data bit lines and an average of two data bit lines is varied during transmission, according to one embodiment of the present invention. Therefore, maximum power consumption for the data transmission is reduced. A data word line is not limited to data bit lines physically separated, but, may be a plurality of data bit signals transmitted through a single bit line in a time shifted or time shared manner.

To make the signal transformation easy and make data transfer fast, it is desirable that the number of physical data bit lines for transmitting the transformed signal is greater than the number of data bit lines for the original signal, i.e. the number of transformed signal bits (e.g. y times m) is greater than n. For data transfer, a circuit for performing the signal transformation between the original signal and the transmitted signal is provided in a sending circuit block and a receiving circuit block.

For a typical example, the original signal is a level representation signal having n bits and the transmitted transformed signal is a transition representation signal having more than n bits, preferably the number of transformed signal bits is an integer multiple of n.

The original signal may represent data values to the nth power of base x and the transformed signal represent data values to the yth power of base m, wherein y is greater than n. The transformed signal uses m groups of y data bits each and information is transmitted dependent on whether or not there is a transition between the level of two values taken by respective data bits of the base m series.

As a general example, the original signal is based on the xth power of base 2 (e.g., fourth power) and represents the data value by the level of x data bit lines (e.g., four data bit lines). The transformed signal includes two groups (m=2) of y data bit lines for each group representing respective values within a maximum of the yth power of base m (e.g., one group representing upper two input bits and another group representing the lower two input bits, respectively).

Power consumption is reduced by reducing the frequency of the transmitted signal data variation as compared to the original signal. As a typical example, each group of the transmitted signal includes four data lines. Only one of the data lines of each group is varied at a time, so that based upon the possible combinations of varied data lines (four times four) there are sixteen patterns for the transmitted signal to represent an original signal having four bits, and the maximum variation of data bit lines for transmission can be set to 2.

BRIEF DESCRIPTION OF THE DRAWINGS

The embodiments of the present invention are described below in conjunction with the figures, in which:

FIG. 3 is a truth table of a transition representation signal and a level representation signal;

FIGS. 14A and 14B together are a truth table useful for a combination circuit when an 8 bit signal is transmitted by a 14 bit transition representation signal;

FIGS. 15A and 15B are together a truth table useful for a combination circuit when an 8 bit signal is transmitted by a 14 bit transition representation signal;

FIGS. 16A and 16B are together a truth table useful for a combination circuit when an 8 bit signal is transmitted by a 15 bit transition representation signal;

FIGS. 17A and 17B are together a truth table useful for a combination circuit when an 8 bit signal is transmitted by a 15 bit transition representation signal.

DESCRIPTION OF THE PREFERRED EMBODIMENT

A description will be given of the present invention by reference to the accompanying drawings.

Figure 2:
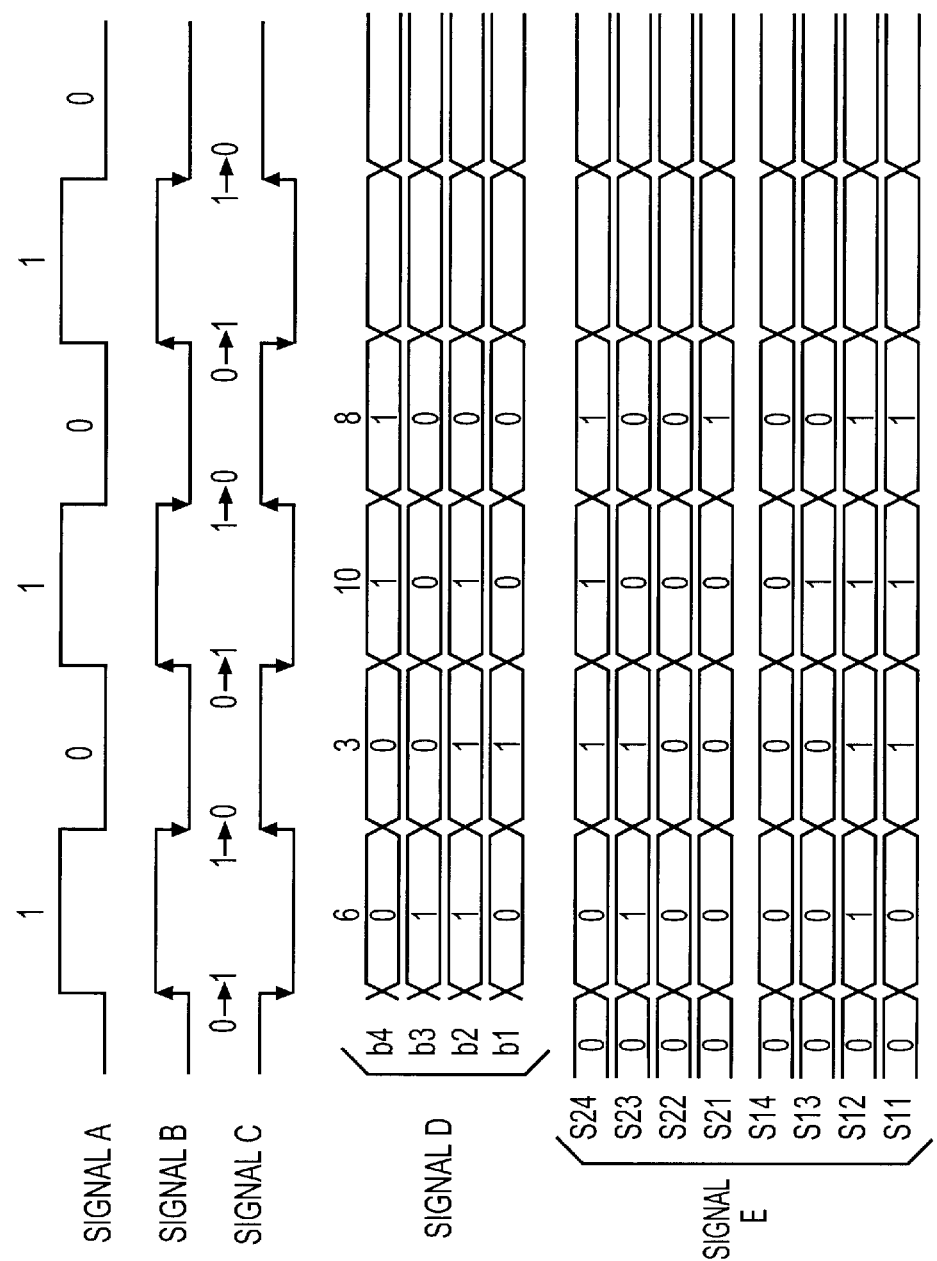
FIG. 2 is a signal transmission synchronized timing chart example based upon the present invention.

FIGS. 2 and 3 are useful in providing a description and a definition of a level representation signal and a transition representation signal used with the present invention. Logic bit line signals A, B and C shown in FIG. 2 are 1 bit signals, respectively.

The signal A is an example of the level representation signal and includes two states of a high voltage status (representation by '1' in FIG. 2) and a low voltage status (representation by '0' in FIG. 2), as a normal logic signal. In the level representation signal, a signal voltage level directly corresponds to a logic status as a logic signal.

The signal B is an example of a transition representation signal and logic is transmitted based upon the rule that a logic status is always changed to another status by varying a signal level, either up or down. In FIG. 2, a logic value '1' and '0' are represented in signal B, as in the signal A.

In other words, for the transition representation signal, it is essential to vary the signal level to change the logic status and the level itself does not convey information. Accordingly, the signal C, which is a reversed voltage level of the signal B, represents the same logic as the signal A.

In an example using the above bit line signals A, B and C, there is no difference essentially between the level representation signal and the transition representation signal, because with each a 1 bit logic signal is handled.

A signal D shows an example of a four bit, level representation, signal, and signal D represents a binary number with attached weights of 1, 2, 4 and 8 in the order from the lower b1 bit to the higher b4 bit. Signal D, in FIG. 2, is an example for transmitting values of 6, 3, 10 and 8, serially in order.

A signal E is an example for transmitting values of 6, 3, 10 and 8 serially by a transition representation signal on 8 bit lines for transmitting 8 bit data, as effectively as the level representation signal D. Although the signal level ('0' or '1') is indicated in the signal E, an information whether or not the signal level is varied, for the time variance from left to right in FIG. 2, is the important matter. In the example signal E, an 8 bit data value is represented based upon the rule that only one bit is varied in a group of four bits from S11 to S14 and only one bit is varied in a group of four bits from S21 to S24, and the rule that an 8 bit data value is transmitted as represented by the combination of bit position varied in the respective groups as shown in the truth table of FIG. 3.

In FIG. 3, a character 'u' represents that a bit level is unchanged and a character 'c' represents that the bit level is changed. Values of four are represented in each group dependent on which single position of each four bit group is varied. Values of sixteen (e.g., 4 times 4) is obtained by two groups of four bits for each group. As seen from FIG. 3, for the signal E of FIG. 2, assuming the initial condition of S11 through S24 as all zero, a value 6 is represented by varying respective values of S12 and S23, and a value 3 is represented by varying respective values of S11 and S24. In the same manner, a value 10 and a value 8 are represented based upon the relation of the FIG. 3. Therefore, a value of four bit data in the normal level representation is represented by changing only a maximum of two bits with the transition representation, thereby limiting the number of bits varied all at once to a maximum of two, and as will be seen later, an average of one.

In general, whereas a binary number according to the level representation of n bits can represent a value of the nth power of base 2, a value can be represented as well by using m groups (e.g. on the condition that the mth power of base n is greater than or equal to nth power of base 2) of transition representation, where only one bit of the bits is varied for each group. Under the rule that the maximum number of bits varied all at once is only k bits for transition representation of n binary bit data and/or the rule that the average number of bits varied all at once is less than k bits for n bit binary data, a value is represented by the transition representation signal of m groups, where n, m and k are integer numbers greater than 1.

Figure 1:
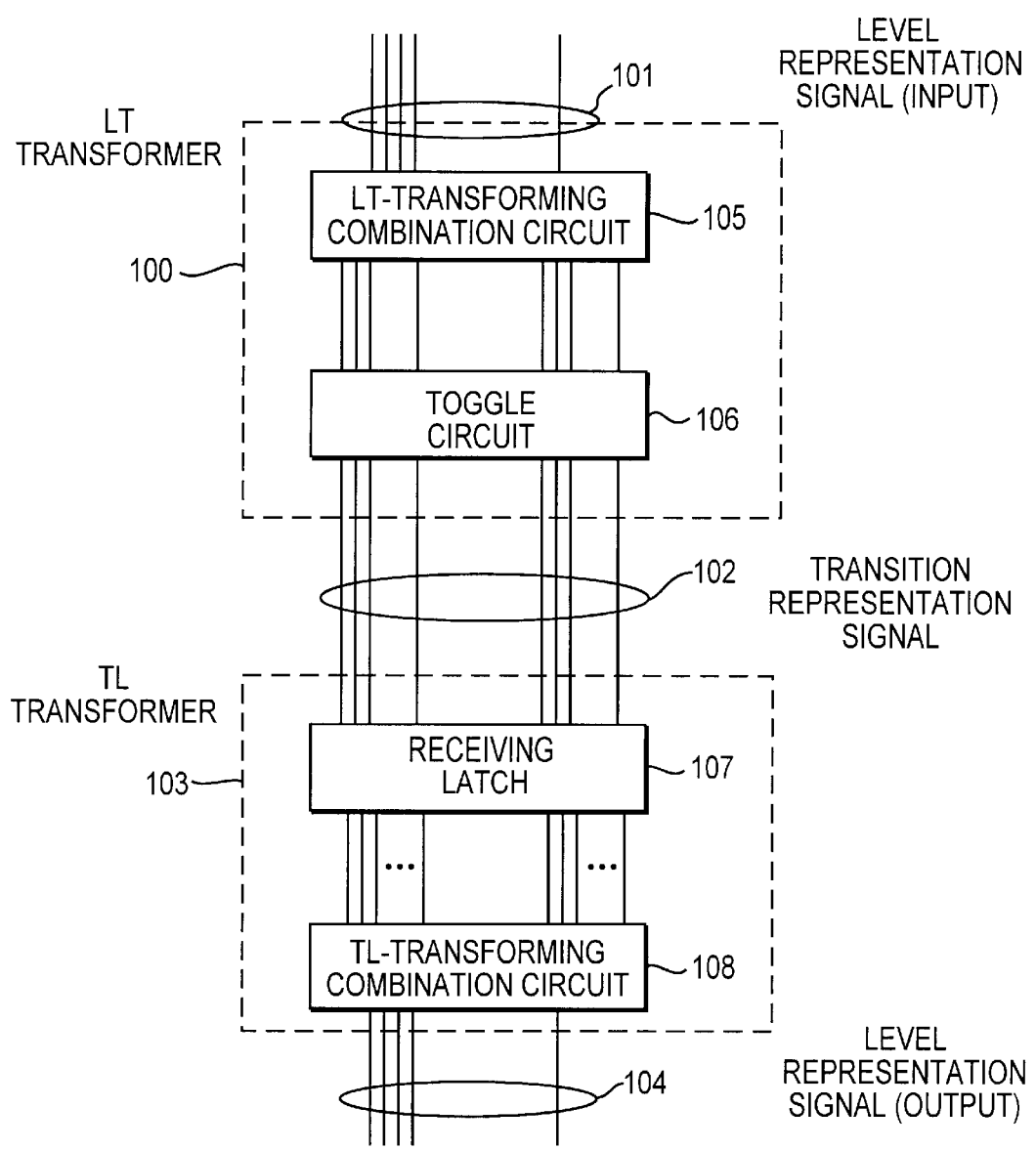
FIG. 1 is a circuit configuration showing an embodiment of the present invention.

A description of an embodiment of the present invention uses FIG. 1 and is based upon the aforementioned definitions and basic principle.

FIG. 1 shows a diagram of a configuration of a signal transmission circuit based upon the present invention. LT-transformer 100 transforms a normal, input level representation signal 101 into a transition representation original signal and outputs a transition representation transformed signal to the transmission line 102. TL-transformer 103 transforms the transition representation signal transmitted by the transmission line 102 back into the level representation original signal and outputs the original signal as an output signal 104.

The LT-transformer 100 includes an LT-transforming combination circuit 105 and a toggle circuit 106. The LT-transforming combination circuit 105 generates a logic signal having '1' for a changed bit and '0' for an unchanged bit, when the n bit input original signal 101 is transformed to the transition representation of m groups according to the truth table of FIG. 2. This transition representation logic transformed signal is input to the toggle circuit 106. The toggle circuit 106 has an identical function for each of the bits, namely it outputs to the transmission line 102 a logic value that is a reversal of the present held logic value when '1' is input to the toggle circuit 106 and outputs the present held logic value to the transmission line 102 when '0' is input to the toggle circuit 106.

The TL-transformer 103 includes a receiving latch 107 and a TL-transforming combination circuit 108. The receiving latch 107 receives a transition representation signal transmitted by the transmission line 102, outputs '1' for a bit changed in input voltage level and outputs '0' for a bit unchanged in input voltage level. This resulting signal is input to the TL-transforming combination circuit 108. The TL-transforming combination circuit 108 is a combined circuit to reverse an input/output relation of the LT-transforming combination circuit 105, and if '1' is input as a changed level bit and '0' is input as an unchanged level bit, an output signal 104 that is identical to the original signal 101 (therefore also called the original signal) is produced by the combination of the bits.

The following detailed description of the respective circuits using an example of a four bit binary input number for the original signal 101 in FIG. 1 (wherein one bit line corresponds to level representation signal A of FIG. 2), and using the truth table of FIG. 3.

Figure 4:
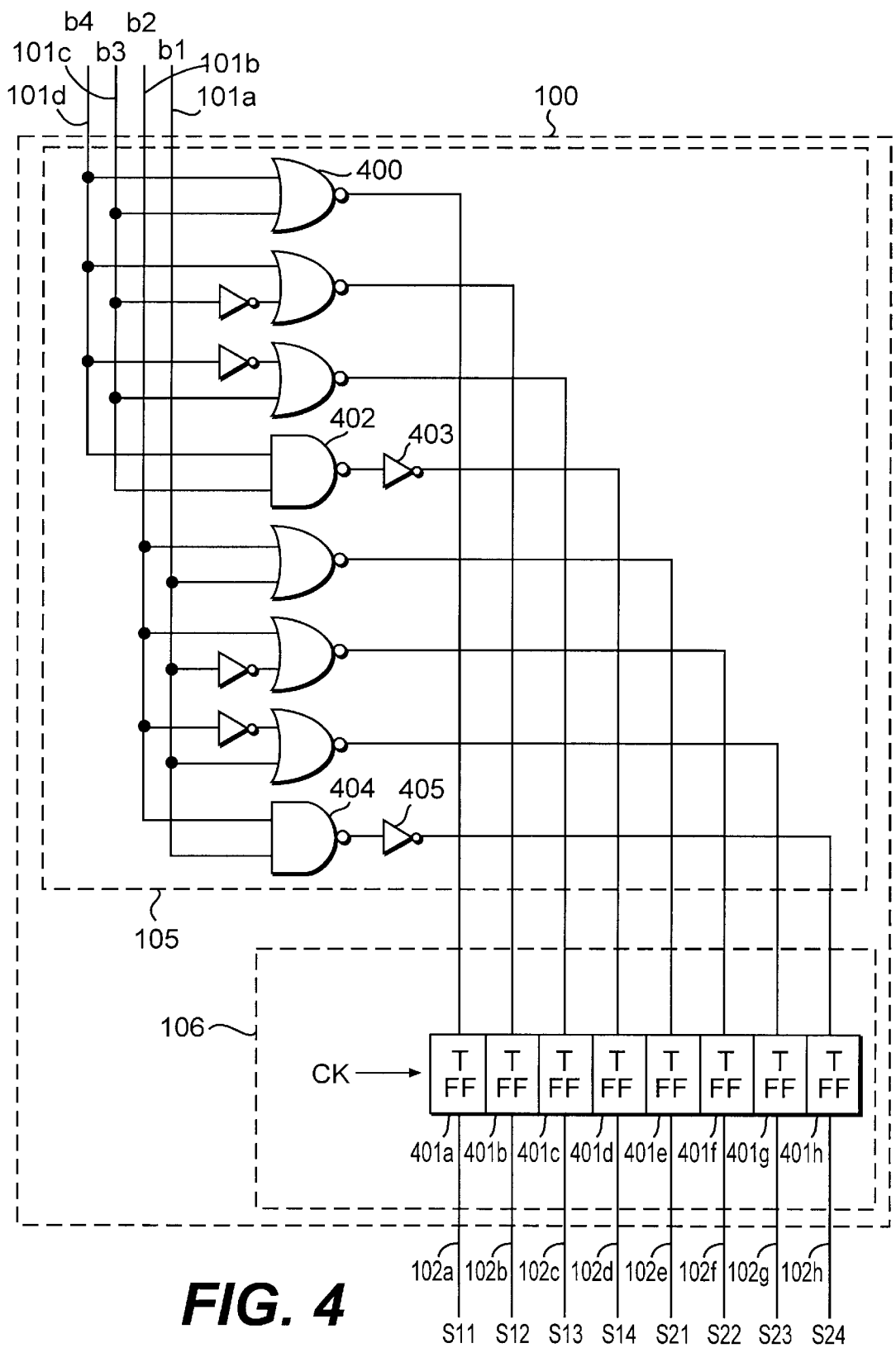
FIG. 4 shows an embodiment of an LT-transformer, for example from 4 bits to 8 bits, as a part of FIG. 1.

FIG. 4 shows a circuit diagram of the LT-transformer 100 of FIG. 1. Input bit signals 101a through 101d correspond to a binary number of four bits as the input signal 101. The LT-transforming combination circuit 105 has a plurality of logic circuits (as shown). This combination logic can be designed with the following truth table. The truth table is formed by transforming 'u' (unchanged) of the table of FIG. 3 into '0' as an output and by transforming 'c' (changed input) of the table of FIG. 3 into an output '1'. If upper bits b4 and b3 of the input 4 bits are '0', then S11 is varied, for example. This condition is detected by a NOR logic gate 400. In the same manner, logic gates other than logic gate 400, e.g. logic gates 402, 403 and 404, 405, for example, detect the condition when an input bit of the LT-transforming combination circuit 105 is varied and feed an output, respectively, to flip flops 401a through 401h. The toggle circuit 106 includes toggle type flip-flops 401a through 401h. Because the toggle type flip-flop outputs a value reversed in relative to the present held value when an input is '1' and outputs the present held value when an input is '0', a function of the toggle circuit 106 can be realized by a flip-flop for each bit. The outputs of the respective flip-flops are connected as the respective bits 102a through 102h of the transmission line 102 of FIG. 1.

By operating according to the truth table of FIG. 3, the LT-transformer 100 of FIG. 4 has the following truth table relationship between the input bits b1, b2, b3, b4 and the output bits s81, s12, s13, s14, s21, s22, s23, s24:

| INPUT | OUTPUT | | | | | | | |
|---|---|---|---|---|---|---|---|---|
| | to | to | to | to | to | to | to | to |
| b4 b3 b2 b1 | 401d | 401c | 401b | 401a | 401h | 401g | 401f | 401e |
| 0 0 0 0 | 0 | 0 | 0 | 1 | 0 | 0 | 0 | 0 |
| 0 0 0 0 | 0 | 0 | 0 | 0 | 0 | 0 | 0 | 0 |
| 0 0 0 0 | 0 | 0 | 0 | 0 | 0 | 0 | 0 | 0 |
| 0 0 0 1 | 0 | 0 | 0 | 1 | 1 | 0 | 0 | 0 |
| 0 0 0 0 | 0 | 0 | 0 | 0 | 0 | 0 | 0 | 0 |
| 0 0 0 0 | 0 | 0 | 0 | 0 | 0 | 0 | 0 | 0 |
| 0 0 1 0 | 0 | 0 | 1 | 0 | 0 | 1 | 0 | 0 |
| 0 0 1 1 | 0 | 0 | 1 | 0 | 1 | 0 | 0 | 0 |
| 1 0 0 0 | 0 | 0 | 0 | 0 | 0 | 0 | 0 | 0 |
| 1 0 0 1 | 0 | 1 | 0 | 0 | 0 | 0 | 1 | 0 |
| 1 0 1 0 | 0 | 1 | 0 | 0 | 0 | 1 | 0 | 0 |
| 1 0 1 1 | 0 | 1 | 0 | 0 | 1 | 0 | 0 | 0 |
| 1 1 0 0 | 1 | 0 | 0 | 0 | 0 | 0 | 0 | 1 |
| 1 1 0 1 | 1 | 0 | 0 | 0 | 0 | 0 | 1 | 0 |
| 1 1 1 0 | 1 | 0 | 0 | 0 | 0 | 0 | 0 | 0 |
| 1 1 1 1 | 1 | 0 | 0 | 0 | 1 | 0 | 0 | 0 |

Figure 5A:
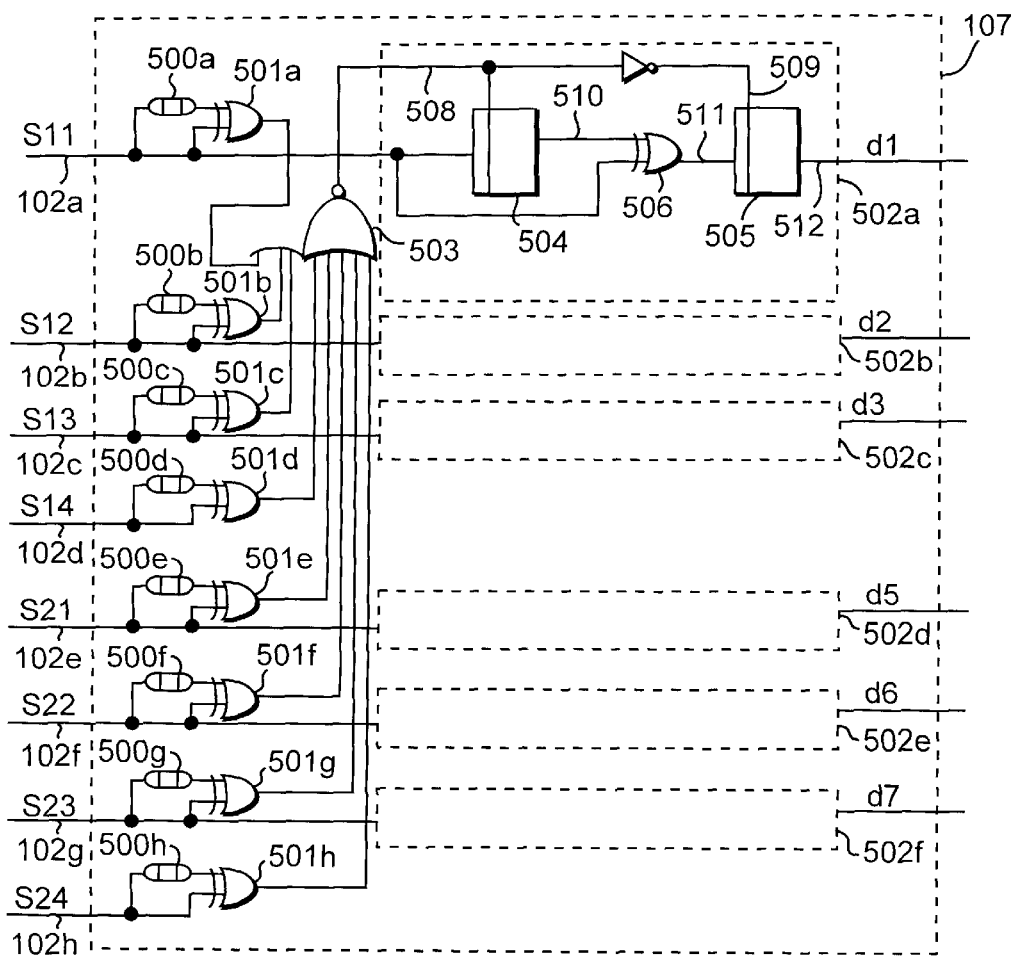
FIGS. 5A and 5B together show an embodiment of a TL-transformer, for example from 8 bits to 4 bits, as a part of FIG. 1.
Figure 5B:
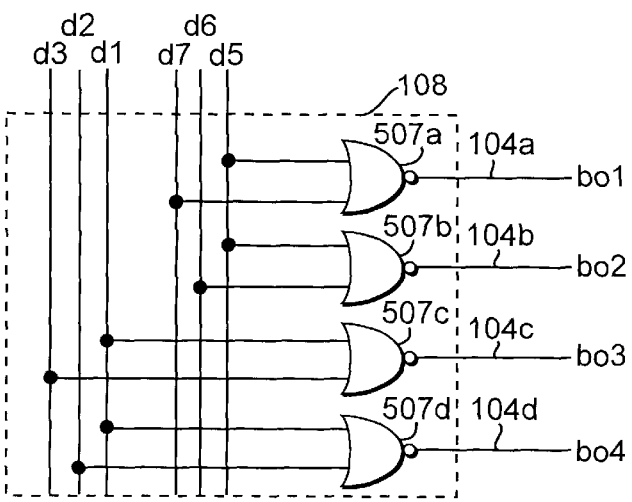

FIGS. 5A and 5B show an example of the TL-transformer shown in FIG. 1. This circuit is a self-synchronized circuit for outputting a new evaluation result each time one of the received signals 102a through 102h from the transmission line 102 is varied. Logic gates 501a through 501h and delay elements 500a through 500h are provided for the respective bits, for detecting this signal variation. Variation detection circuits 502a through 502f output '1' to a varied bit and "0" to an unvaried bit in the input signals 102a through 102h, respectively.

Because identical circuits are provided for each of these bits, only the one circuit for a bit is described in detail. An exclusive-OR calculation is performed for both a received signal delayed by a delay element 500a and a direct received signal at a logic gate 501a. Based upon this calculation, when a received signal is varied, a pulse signal at the time determined by the delay element 500a is output from the logic gate 501a. A logic gate 503 performs NOR calculation for a signal variation from the respective bits and generates a negative pulse when the signal variation occurs in any one of the bits. This negative pulse is a clock signal supplied for both an edge trigger type flip-flop 504 and a level sense type flip-flop 505 in a variation detection portion 502a and holds a signal when the clock signal is input. The flip-flop 504 holds a value before the input signals 102a through 102h are varied and a logic gate 506 outputs '1' when the corresponding bit is varied. A flip-flop 505 holds an output of the logic gate 506.

Figure 18:
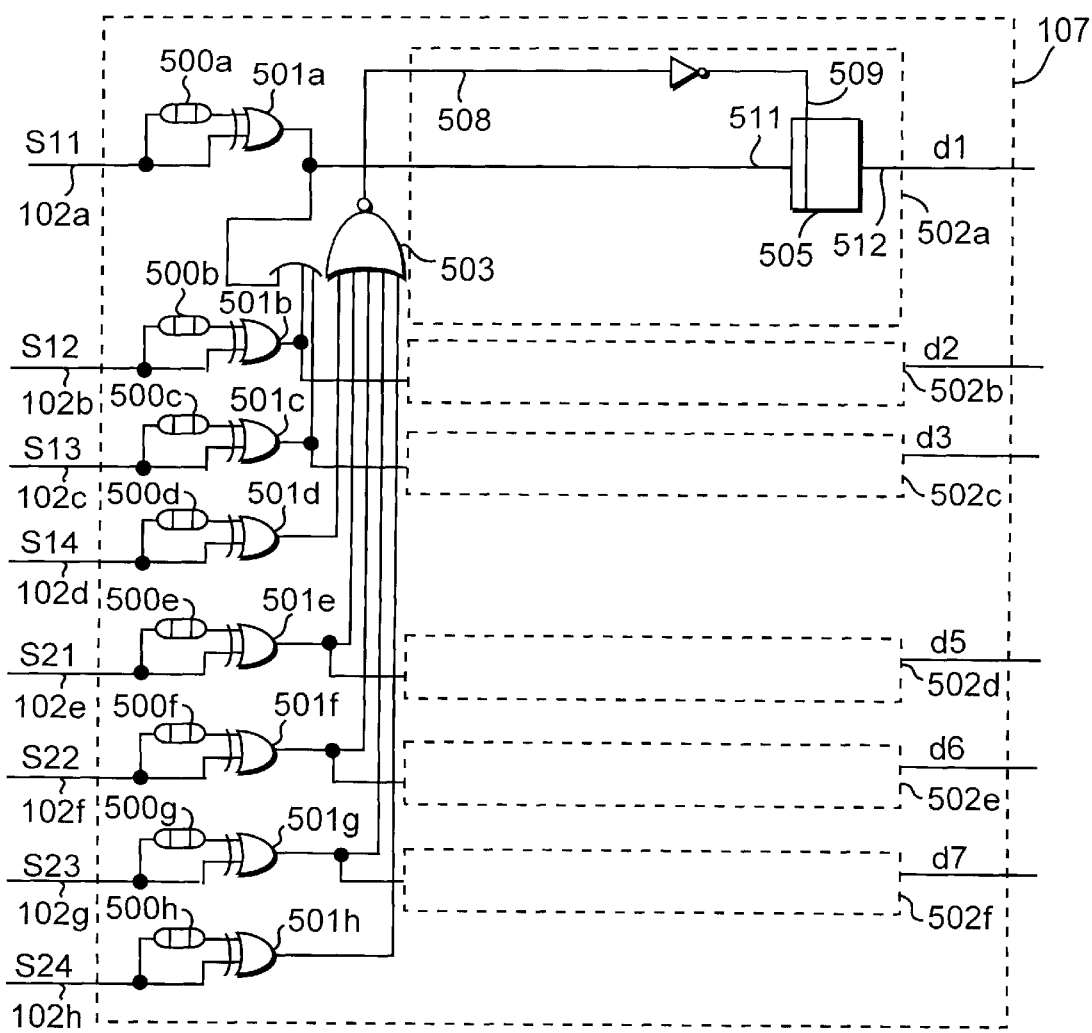
FIG. 18 shows a modification of FIGS. 5A and 5B.

The receiving latch 107 in the TL-transformer of FIGS. 5A and 5B may be modified according to the following reasoning. The logic gate 506 detects that the corresponding bit of S11 and S24 is varied and the function of the gate 506 is equivalent to each function of the logic gates 501a to 501h. Accordingly, it is possible to modify FIG. 5A, to obtain FIG. 18, by removing each flip-flop 504 and removing each logic gate 506, so that detection portions 502a to 502f are abbreviated and the outputs of the logic gates 501a to 501g are connected directly to respective ones of the inputs of the flip-flops 505.

The outputs from the variation detection portions 502a through 502f are input as signals d1 through d7 to the TL-transforming combination circuit 108. This TL-transforming combination circuit 108 functions according to the truth table 3 like the LT-transformer in FIG. 4. A signal d1 is considered as an input corresponding to S11, a signal d2 is considered as an input corresponding to S12, a signal d3 is considered as an input corresponding to S13, a signal d5 is considered as an input corresponding to S21, a signal d6 is considered as an input corresponding to S22 and a signal d7 is considered as an input corresponding to S23. The respective bits of the representation number columns corresponds to bits bo1 through bo4.

Figure 6:
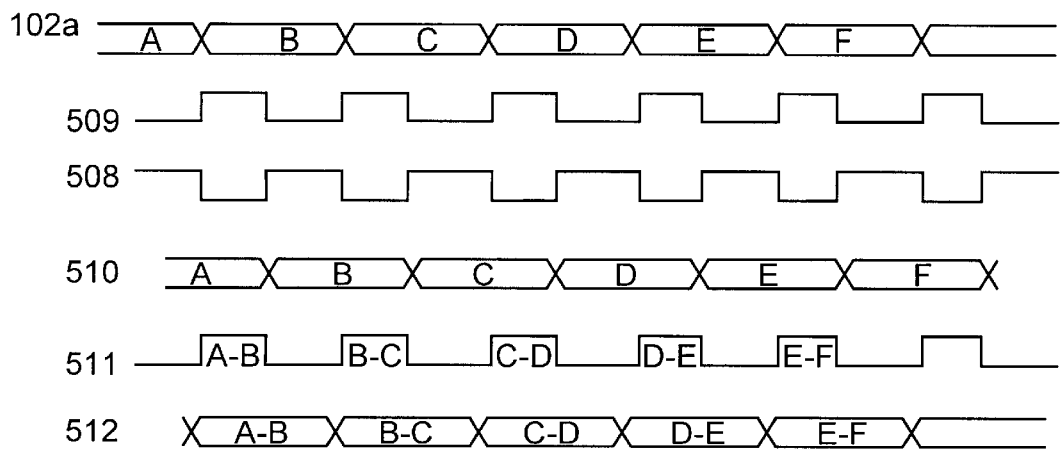
FIG. 6 is a synchronized timing chart indicating an operation of a self-synchronized type TL-transformer.

An operation of the TL-transformer 103 shown in FIGS. 5A and 5B is described by using the timing chart of FIG. 6.

When a received signal 102a is varied as in FIG. 6, the variation is detected by the logic gate 501a and the logic gate 503 outputs a negative pulse 508. This pulse is input to a positive edge trigger type flip-flop 504 and the flip-flop 504 latches a newly varied signal (a value B in FIG. 6) delayed by a pulse width. Therefore, a difference signal value is generated in an input/output of the flip-flop 504 by the time corresponding to this pulse width and the logic gate 506 outputs '1' during that time period. Because the flip-flop 505 sets on an inverted pulse clock signal and latches an output of the logic gate 506, an output 512 of the variation detection portion outputs '1' when there is a received signal change and outputs '0' when there is no received signal change as in FIG. 6, during a time interval between the occurrence of a received signal change and any following occurrence of a received signal change.

The aforementioned example circuit of FIG. 1 transforms an original logic signal 101 having level representation of four bits into a transformed logic signal 102 having transition representation, and then transmits the transformed logic signal 102. By using the circuit of FIG. 4, values of 0 through 15 can be transmitted by using a signal line of 8 bits and by varying a maximum of 2 bits of the 8 bits, as shown in the signal E of FIG. 3. In the TL-transformer 103 as indicated in FIGS. 5A and 5B, an important point is that there exists only 6 inputs for detection portions 502a–f of the input of the TL-transforming combination circuit 107. This means that in the transition representation signal of one of m groups having n bits, when there is no signal variation for an arbitrary n-1 bits, the rest of the bits (that is, 1 bit) is varied. In the aforementioned transmission circuit, a circuit reducing the number of varied bits of the transmission line is provided.

Figure 7:
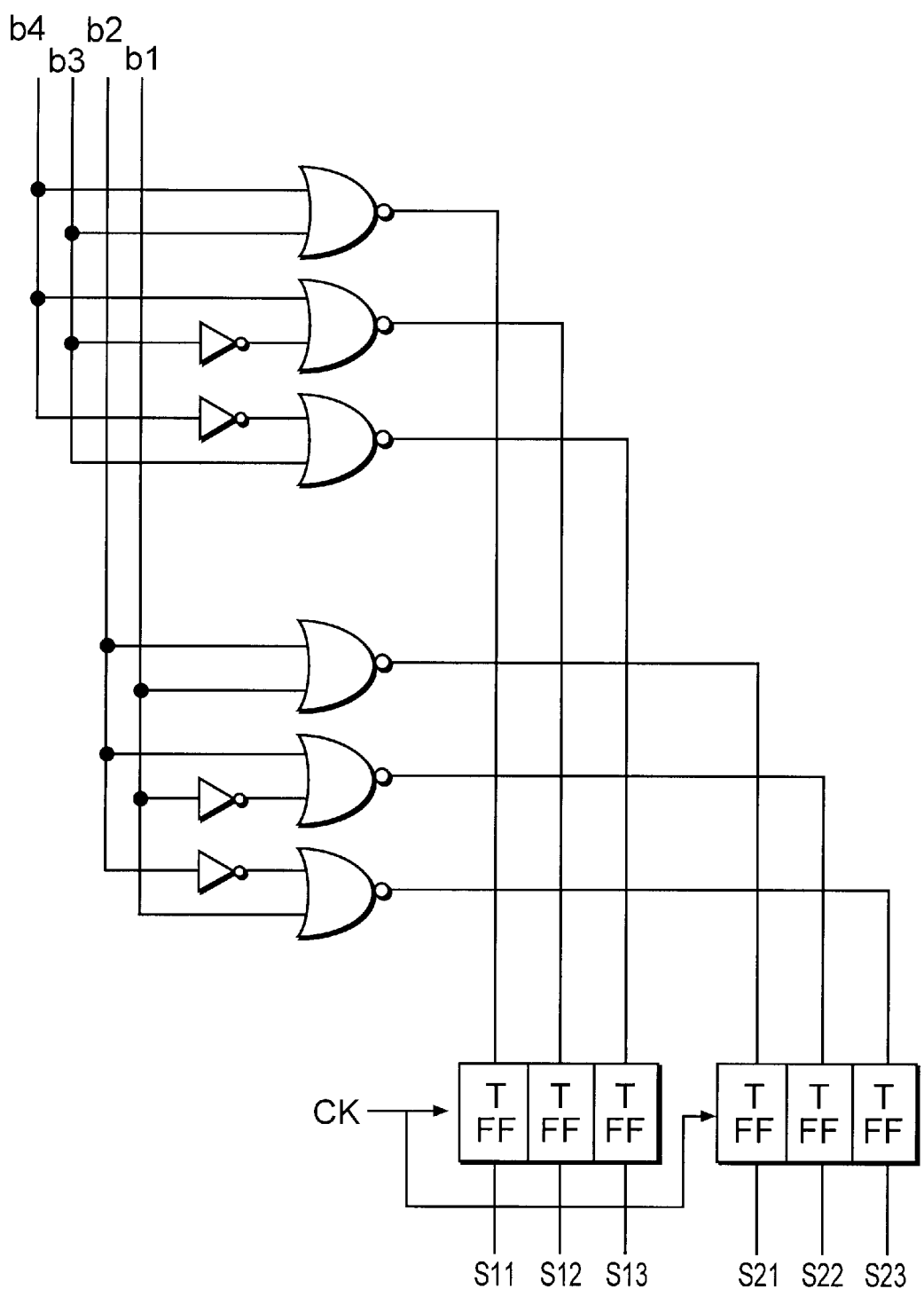
FIG. 7 shows an LT-transformer, for example from 4 bits to 6 bits, as a part of the circuit of FIG. 1.

FIG. 7 shows an example circuit removing the logic gates 402, 403, 404 and 405 from the LT-transformer as in FIG. 4, by considering the aforementioned characteristic. This circuit can reduce the number of bits required for the transmission from 8 to 6 bits. However, as in FIGS. 5A and 5B, when a self-synchronized type circuit is considered as the TL-transformer, the variation of the respective bits of the removed S14 and S24 can not be detected. Therefore, a circuit for self-detecting a timing of the variation of the signal being transmitted in synchronism with the clock signal, is useful for the TL-transformer.

Figure 8A:
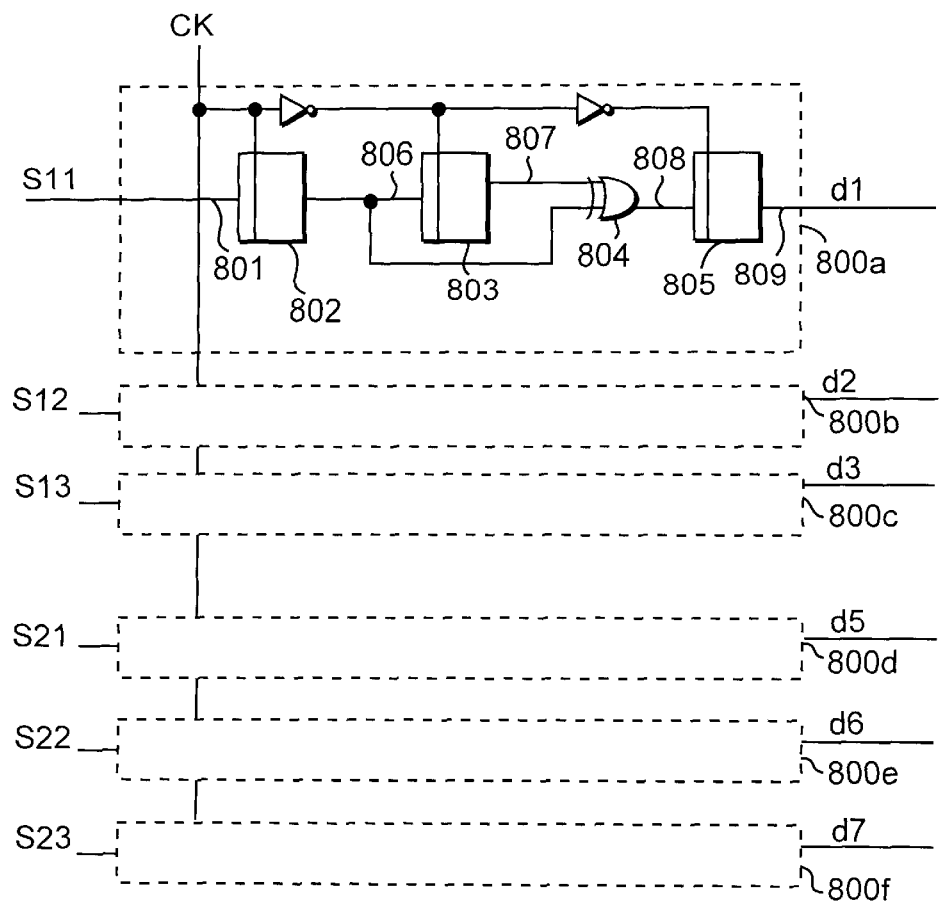
FIGS. 8A and 8B together show a TL-transformer, for example from 6 bits to 4 bits, as a part of the circuit of FIG. 1.
Figure 8B:
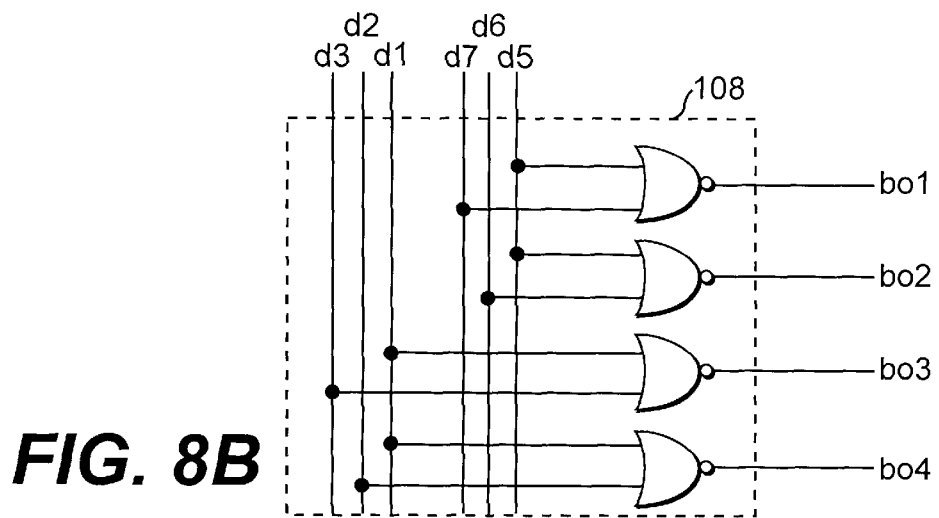

FIGS. 8A and 8B show an example TL-transformer 103 for evaluating signals S11 through S23 transmitted in synchronism with the clock signal. Only a circuit for one bit is described because the variation detection portions 800a through 800f are identical. A received signal 801 is latched by the edge trigger type flip-flop 802. A reversed phase clock signal CK is input to the edge trigger type flip-flop 803, and based upon this clock signal, a logic gate 804 compares an old and new status of the received signal 801 and outputs the result 808. A level sense type flip-flop 805 latches the result 808 of the logic gate 804 and holds '1' as value 809 for a bit 511 having a signal variation.

Figure 9:
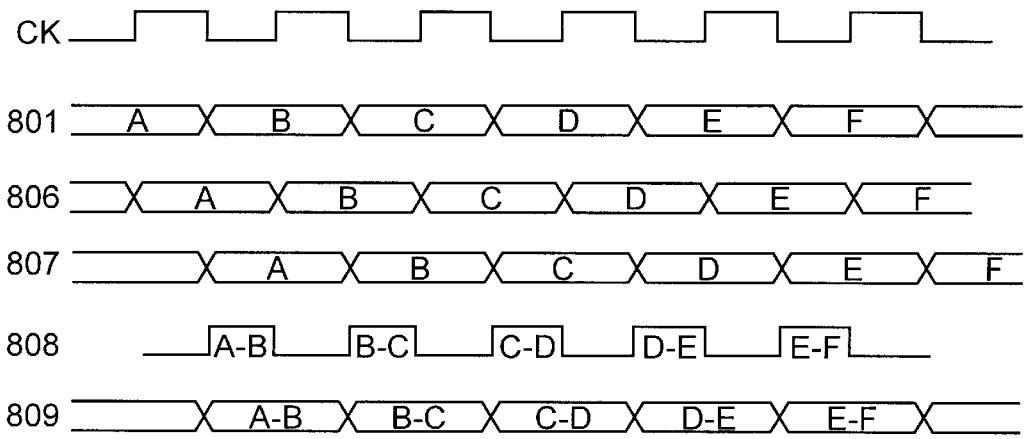
FIG. 9 is a synchronized timing chart indicating an operation of a clock synchronized type TL-transformer.

FIG. 9 shows an example timing chart for an operation of the TL-transformer of FIGS. 8A and 8B. The received signal 801 is latched by the flip-flop 802 in synchronism with the clock signal CK. After a half period of a cycle, the flip-flop 803 latches the signal 806 and the logic gate 804 compares levels of the signal 807 and the signal 806. When there is a difference between the signal 806 and the signal 807, this means that a logic value of the bit is varied and the logic gate 804 outputs '1'. The output of the logic gate 804 is latched by the level sense type flip-flop 805 and the output signal 809 is obtained.

In the embodiment of the aforementioned two examples, the level representation input original signal of four bits is transmitted by using a transmission line of two groups of 4 bits each or two groups of 3 bits each. The present invention transmits a signal by using a plurality of groups of a transition representation signal, therefore, it is possible to transmit the respective groups in a time shifted and time shared manner.

Figure 10:
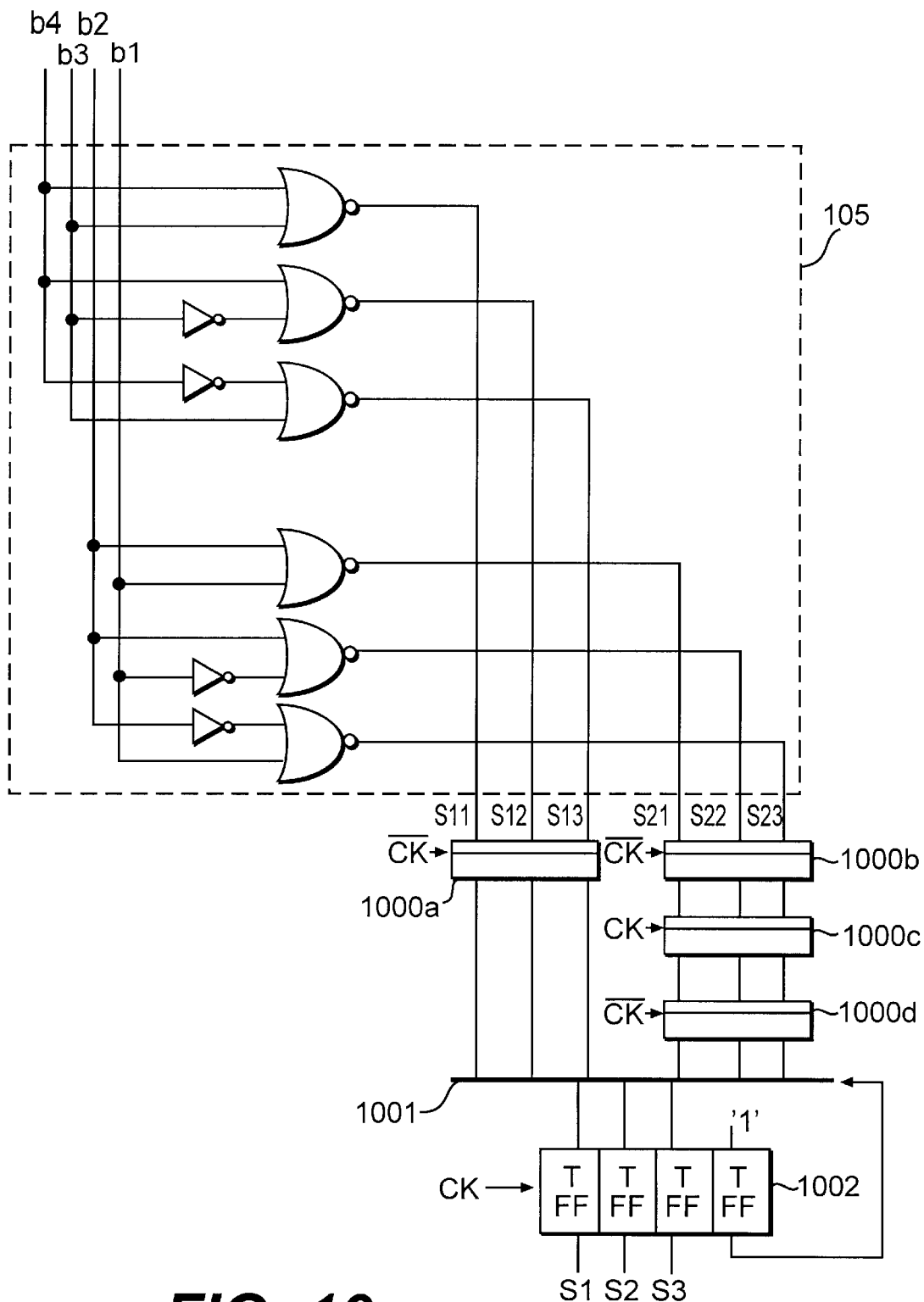
FIG. 10 shows an LT-transformer, for example for performing a time shared transmission.

The LT-transformer 100 shown in FIG. 10 is a circuit for transmitting S11 through S13 and transmitting S21 through S23, as in FIG. 7. Flip-flops 1000a through 1000d are timing latches for transmitting an output of the LT-transforming combination circuit 105, by using 3 bits in the time shared manner. A selector 1001 outputs on signal lines S1 through S3 by selecting either one of the group of S11 through S13 or the group of S21 through S23, in response to an output value of a toggle type flip-flop 1002. Because an input of the flip-flop 1002 is fixed to '1', the selector 1001 performs an output operation of the group of S11 through S13 and the group of S21 through S23, alternatively for every clock cycle. A TL-transformer also receives a transition representation signal transmitted in the time shared manner to be used for separating the time shared groups.

Figure 11:
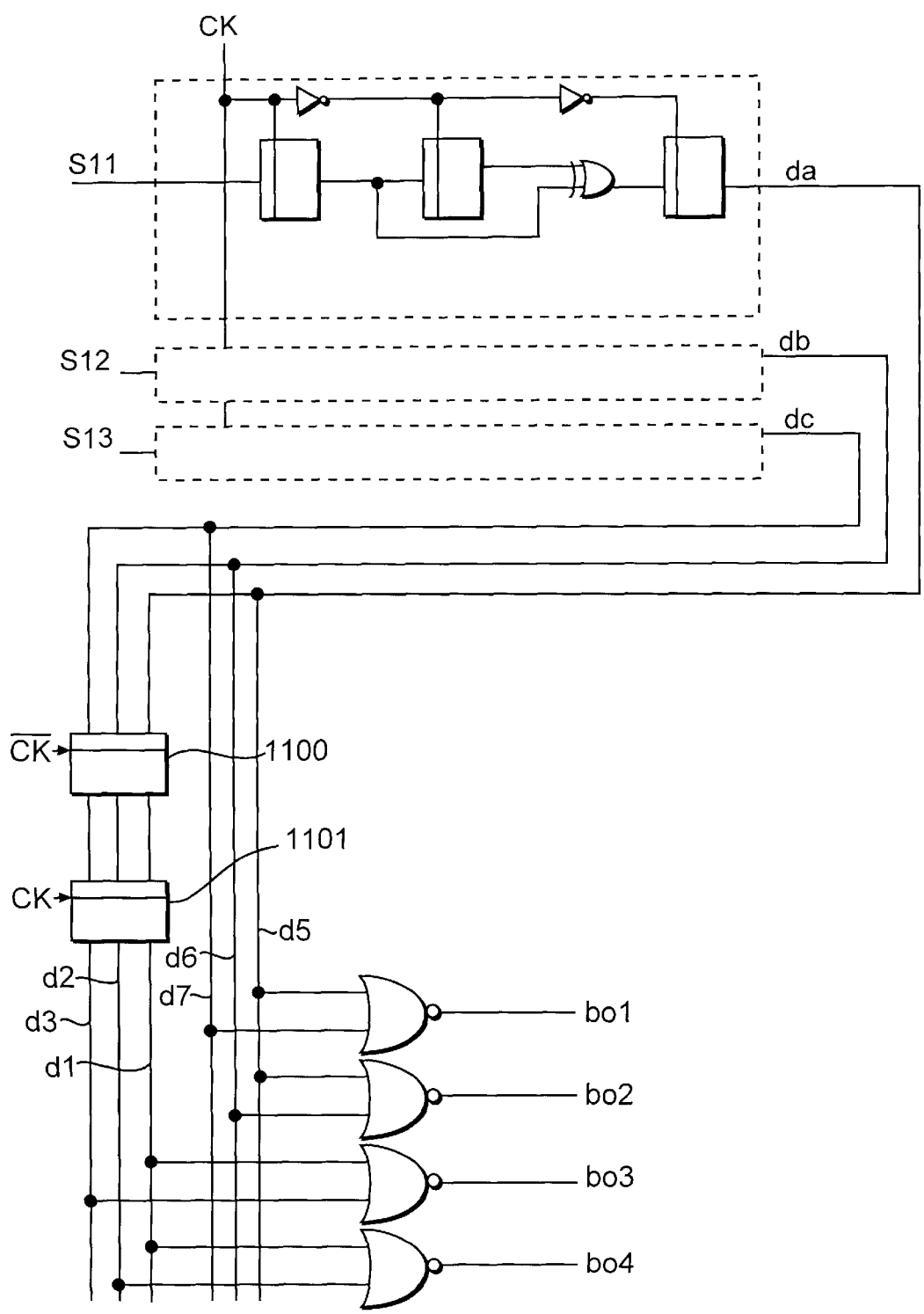
FIG. 11 shows a TL-transformer, for example for performing a time shared transmission.

FIG. 11 shows a circuit diagram of a time sharing TL-transformer 103 to receive the signals transmitted from the circuit of FIG. 10, which results in reducing 6 bit lines used in the clock synchronized type TL-transformer of FIG. 8 into 3 bit lines and receiving the previously transmitted time shared 3 bit signal into a combination logic through timing latches 1100 and 1101.

In the embodiment having the details of FIGS. 4 to 11 for transmitting two groups of 4 bits each, the groups are transmitted in parallel over 8 lines or one group after the other on 4 lines. The transition representation signal is varied by at most one bit in each 4 bit logic group, so that the maximum of two bits and an average number of one bits are varied on the transmission line and kept fixed. Since n/2 bits are varied on the average when a random value is transmitted by using a level representation binary logic signal having n bits in the prior art, a transition representation signal that varies less than the n/2 bits is used in the present invention to provide transmission having the least bit variation and correspondingly the peak current through the circuit is smaller than the prior art, and accordingly the design conditions of the circuit can be loosened as compared to the prior art. This advantage is considerable when n is greater than 4.

However, if the frequency of the occurrence of bit change in the embodiment of FIGS. 4–11, which determines the power consumption of the transmission circuit is compared to the prior art, because the average change of the number of bits for the transition representation signal is 2 bits and the average change of the number of bits for the original 4 bits logic signal is 2 bits, there is no power consumption difference between them.

On the other hand, the embodiment of FIGS. 12 to 18 reduces the average peak current through the transmission circuit (power consumption) as compared with the original level representation signal transmission and thereby reduces the power consumption of the transmission circuit. That is, the embodiment of FIGS. 12 to 18, for transmitting the transition representation signal, reduces the average change of the number of bits as compared with the original level representation signal described below.

Figure 12:
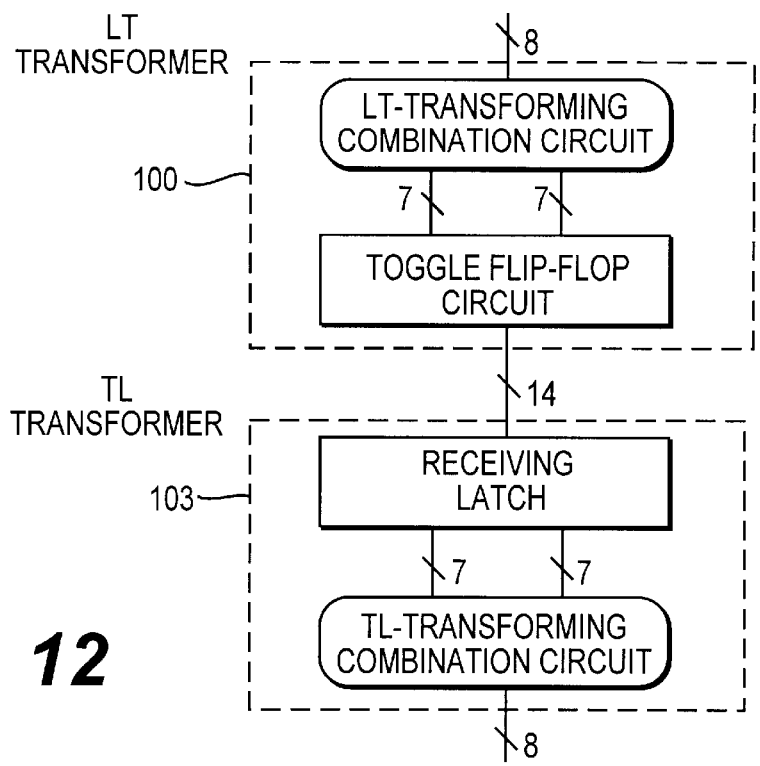
FIG. 12 is a diagram for a circuit transmitting an 8 bit signal by using 14 bits as a transition representation signal.

FIG. 12 shows a circuit configuration when a level representation signal having 8 bits is transmitted by two groups of a transition representation signal, with each group having 7 bits, with only a maximum total of 2 bits varied. A value represented by 8 bits is the 8th power of base 2 (that is, 256 patterns). The present invention varying only a maximum of 2 bits, i.e. one bit of the 8 bits of each group, during transmission, provides 28 unique bit patterns for the two groups. By using the two groups for the representation of 28 patterns, the status of 28 times 28 (that is, 784 patterns) are represented during transmission and thereby the original 256 patterns of value to be represented can be covered during transmission. For the LT-transforming combination circuit and the TL-transforming combination circuit, the aforementioned variation uses a truth table as in FIGS. 14A and 14B and FIGS. 15A and 15B. In the LT-transforming combination circuit of the LT-transformer, a level representation value of the truth table, as in FIGS. 14A, 14B and 15A, 15B becomes an input and a transition representation value of the truth table becomes an output. In the TL-transforming combination circuit of the TL-transformer, a level representation value of the truth table as in FIGS. 14A, 14B and 15A, 15B becomes an output and a transition representation value of the truth table becomes an input. The use of only 7 bits for each group of the transition representation signal is based on the transmission capability of the transition representation signal having n-1 bits equivalent to n bits of a level representation signal, as shown in FIG. 7.

Contrary to the transition representation signal as shown in FIGS. 14 and 15 having two groups of 8 bits, in the transmission circuit of FIG. 12, the output of the TL-transforming combination circuit in the TL-transformer 100 [the transmitted transition representation signal] and the input of the LT-transforming combination circuit in the LT-transformer 103 has two groups of 7 bits. This is because in FIG. 12, logic gates and the bits of the transmitted transition representation signal are abbreviated as well as the embodiment of FIG. 7. This abbreviation is based on the following. The transition representation signal as in FIGS. 14 and 15 represents a numeric value by which two bits are changed in the two groups of 8 bits. Accordingly, even if one bit in each group is abbreviated, when two bits in the rest (7 bits) are varied, the abbreviated bit is unchanged. When one bit in the rest (7 bits) is varied, the abbreviated bit is changed.

Figure 13:
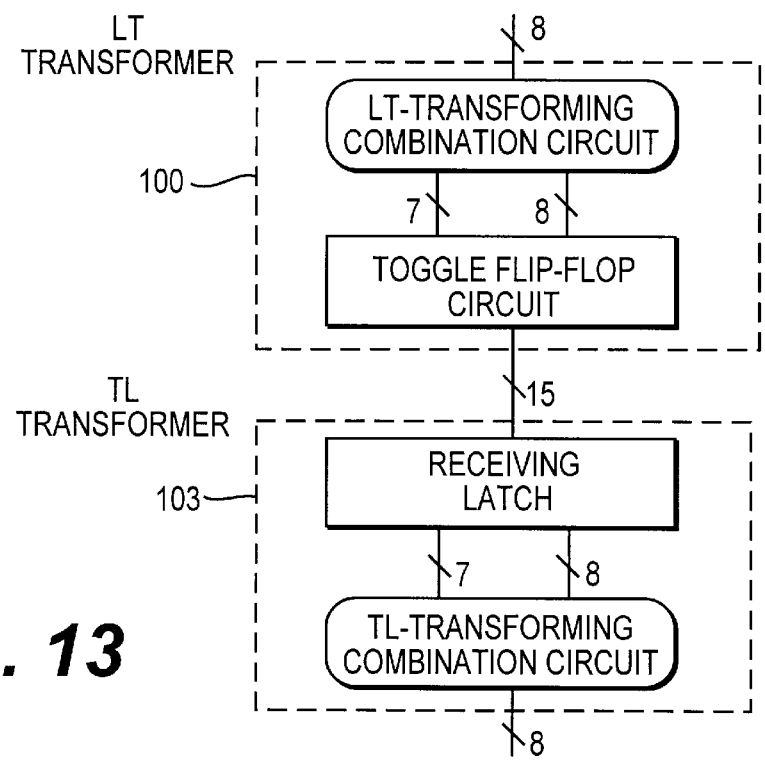
FIG. 13 is a diagram for a circuit transmitting an 8 bit signal by using 15 bits as a transition representation signal.

In FIG. 13, although a level representation original signal having 8 bits is to be transformed and transmitted by two groups of transition representation signals as in FIG. 12, one group of the two groups is the transition representation signal having 7 bits with only a bit varied and the other group of the two groups is the transition representation signal having 8 bits with the number of bits varied being less than 2 bits. When a bit change is represented by 'c' and an unchanged bit is represented by 'u', with the variation of the number of bits being less than 2 bits means that transition representation signals such as 'cuuuuuuu' or 'cucuuuuu' are included.

In a transition representation with only one bit varied, a status of 8 patterns can be represented and if there is a transition representation with a variation of 2 bits, a status of 36 patterns can be represented. Accordingly in FIG. 13, as a whole, a status of 8 times 36 (288 patterns) can be represented and a value equal to the 8th power of base 2 can be covered. The LT-transforming combination circuit and the TL-transforming combination circuit of FIG. 13 are constructed according to the truth table in FIGS. 16A, 16B and 17A, 17B, wherein it is noticed that only 7 of 8 level representation bits of one group are used and therefore transmitted. In this case, the transition representation signal used for the transmission varies with only a maximum of 3 bits, and with an input random value 8 bits of the level representation, the transition variation of a maximum 3 bits is below the average level variation of 4 bits. From the present invention, in the transition representation signal limiting the number of bits varied, not only the number of bits varied at the time of signal transmission is kept fixed at a low number, but also the frequency of the bit variation occurrence itself can be reduced.

According to the present invention, the signal variation bit number for the transmission is limited to below a fixed value by using the transition representation signal limiting the number of bits varied. Therefore, the number of logic gates into which a current flows simultaneously can be kept below a maximum fixed number and an error operation due to an instantaneous voltage drop of the power supply can be prevented. The average number of bits varied during transmission is reduced as compared to the original signal by setting the variation bit number below n/2 of the input level representation signal (n bits) and the power consumption can be reduced when a logic gate, such as a CMOS, is used.

In transmitting a binary number of 8 bits by a transition representation signal of 7 bits+8 bits, a signal varied bit number can be transmitted below 3 bits. When random value is represented as a binary number of 8 bits, there is a variation of maximum 8 bits and on the average, 4 bits variation. Therefore, there is a reduction for both a maximum value and an average value of the number of bits changes.

While a preferred embodiment of the present invention has been described in detail, with variations and modifications, further embodiments, variations and modifications are contemplated within the broader aspects of the present invention, in addition to the advantageous details, in accordance with the spirit and scope of the following claims.

What is claimed is:

1. A circuit for transmitting an original logic signal having n bits, comprising:

a logic circuit for transforming the original logic signal into a transformed logic signal in synchronism with a clock signal, the transformed logic signal having m groups of n bits, a logical value of the transformed logic signal in a current clock cycle being expressed by level transitions of respective bits at a clock cycle transition from a preceding clock cycle to the current clock cycle, wherein only k bits in each of the m groups of the transformed logic signal are varied at each clock cycle transition, wherein k is an integer smaller than n and m is an integer greater than 1;

transmission lines for transmitting the transformed logic signal; and a logic circuit for receiving the transformed logic signal and transforming the thus received transformed logic signal it into the original logic signal.

2. The circuit according to claim 1, wherein a total bit number of varied bits at each clock cycle change among the m groups of the transformed logic signal is smaller than n/2.

3. The circuit according to claim 1, wherein the varied bits number k is not equal between respective groups of the transformed logic signal.

4. The circuit according to claim 1, wherein the logic circuit actually generates n-1 bits among the n bits, by omitting generating a bit of a fixed place, in any one of m groups of the transformed logic signal, and wherein the transmission line transmits the actually generated bits of the transformed logic signal.

5. The circuit according to claim 1, further comprising means for transmitting m groups of the transformed logic signal in a time shared manner.

6. A method of transmitting an original logic signal having n bits comprising the steps of:

transforming the original logic signal into a transformed logic signal in synchronism with a clock signal, the transformed logic signal having m groups of n bits, a logical value of the transformed logic signal in a current clock cycle being expressed by level transitions of respective bits at a clock cycle transition from a preceding clock cycle to the current clock cycle, wherein only k bits in each of the m groups of the transformed logic signal are varied at each clock cycle transition, wherein k is an integer smaller than n and m is an integer greater than 1;

transmitting the transformed logic signal; and receiving the transformed logic signal and transforming it into the original logic signal.

7. The method of claim 6, wherein a total bit number of varied bits at each clock cycle change among the m groups of the transformed logic signal is smaller than n/2.

8. The method of claim 6, wherein the number of varied bits k is not equal between respective groups of the transformed logic signal.

9. The method of claim 6, further comprising the step of generating n-1 bits among the n bits, by omitting generating a bit of a fixed place, in any one of m groups of the transformed logic signal, and transmitting the actually generated bits of the transformed logic signal.

10. The method of claim 6, further comprising the step of transmitting m groups of the transformed logic signal in a time shared manner.

* * * * *